United States Patent
Kishimoto

(10) Patent No.: US 7,577,033 B2
(45) Date of Patent: Aug. 18, 2009

(54) METHOD AND CIRCUIT FOR PERFORMING READ OPERATION IN A NAND FLASH MEMORY

(75) Inventor: Jiro Kishimoto, Mitaka (JP)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 11/771,506

(22) Filed: Jun. 29, 2007

(65) Prior Publication Data

US 2009/0003079 A1    Jan. 1, 2009

(51) Int. Cl.
*G11C 16/04* (2006.01)
(52) U.S. Cl. .................. 365/185.17; 365/185.25; 365/189.09; 365/203
(58) Field of Classification Search ............ 365/185.17, 365/185.25, 189.09, 203
See application file for complete search history.

(56) References Cited

U.S. PATENT DOCUMENTS 5,999,451 A * 12/1999 Lin et al. ............. 365/185.11
2008/0062762 A1 * 3/2008 Doyle ................... 365/185.11
2008/0159032 A1 * 7/2008 Lin ........................ 365/203

OTHER PUBLICATIONS

Tanaka, Tomoharu et al. "a Quick Intelligent Page-Programming Architecture and a Shielded Bitline Sensing Method for 3 V-Only NAND Flash Memory", IEEE Journal of Solid-State Circuits, vol. 29, No. 11, Nov. 1994; 12 pages.

* cited by examiner

*Primary Examiner*—Thong Q Le
(74) *Attorney, Agent, or Firm*—Grossman, Tucker, Perreault & Pfleger, PLLC

(57) ABSTRACT

Disclosed is a method and semiconductor circuit for providing a read operation in a NAND flash memory. The NAND flash memory includes an array of bit lines. The method includes selecting a first set of bit lines of the array of bit lines for performing the read operation. The first set of bit lines are pre-charged to a pre-defined voltage level. At the same time, a second set of bit line are also charged to the pre-defined voltage. The second set of bit lines are in anti-phase to the first set of bit lines. Further, reading of the first set of bit-lines is performed. The second set of bit lines is maintained at the pre-defined voltage level during the reading of the first set of bit lines.

6 Claims, 4 Drawing Sheets

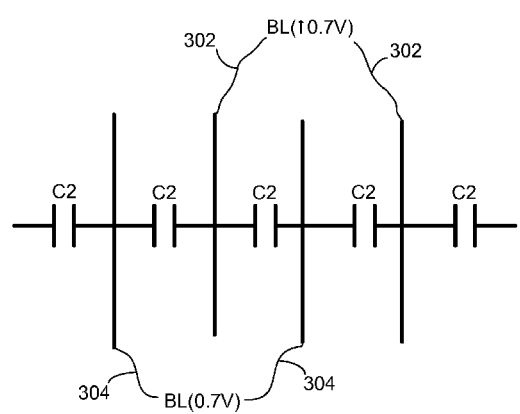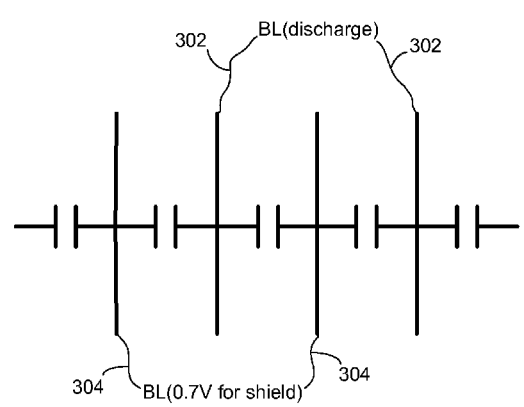
FIG. 3A  FIG. 3B
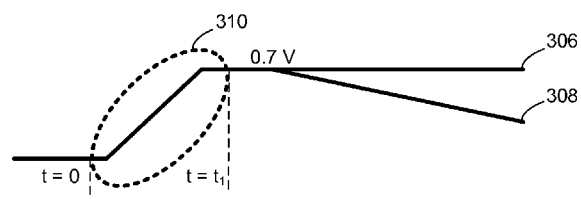
FIG. 3C

METHOD AND CIRCUIT FOR PERFORMING READ OPERATION IN A NAND FLASH MEMORY

FIELD

The present disclosure relates to flash memories and, more particularly, to a method and circuit for performing a read operation in a NAND flash memory.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

FIGS. 3A, 3B and 3C are schematic diagrams illustrating a bit line-bit line coupling capacitance and bit line waveforms in the read operation in a NAND flash memory, according to an exemplary embodiment of the present disclosure.

Like reference numerals refer to like parts throughout the description of several views of the drawings.

DETAILED DESCRIPTION

For a thorough understanding of the present disclosure, refer to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another. The terms "a" and "an" herein do not denote a limitation of quantity, but rather denote the presence of at least one of the referenced item. The term 'set' herein represents a single item or a substantially plurality of such items. In other words, the cardinality of the 'set' can be one or more than one.

Figure 1:
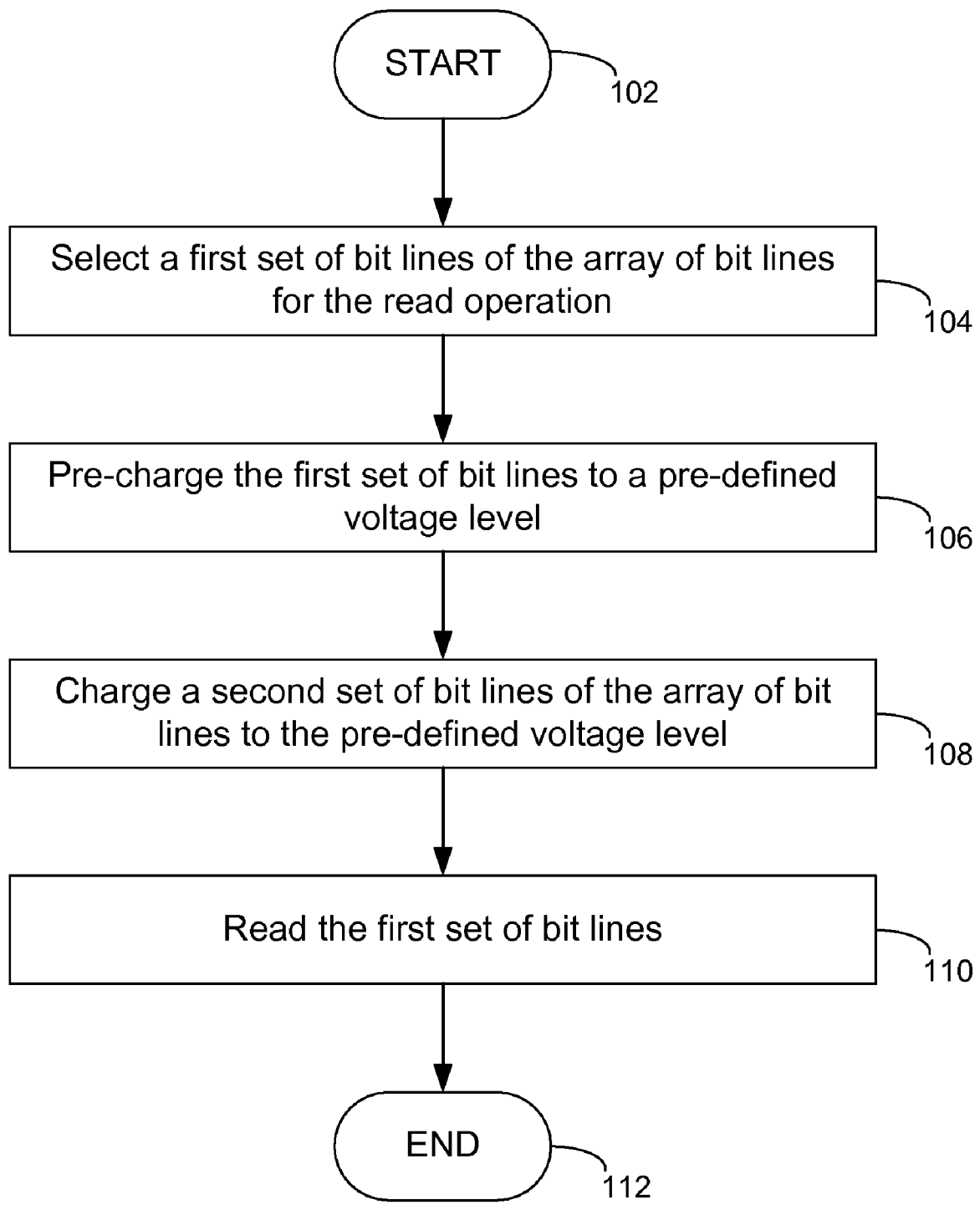
FIG. 1 is a flow diagram illustrating a method for performing a read operation in a NAND flash memory, according to an exemplary embodiment of the present disclosure.

FIG. 1 is a flow diagram illustrating a method for performing a read operation in a NAND flash memory. The NAND flash memory comprises an array of bit lines (BLs). In a typical NAND flash memory, the operation of programming or reading is performed in a page mode. The page mode programming and reading operation involves simultaneous programming and reading of the array of bit lines in the NAND flash memory. The method described in the present disclosure follows shielded bit line architecture. In this architecture, data read in the NAND flash memory is performed separately for even numbered bit lines and odd numbered bit lines of the array of bit lines. The even numbered bit lines and the odd numbered bit lines are anti-phase to each other.

The method for performing the read operation is initiated at 102. At 104, a first set of bit lines of the array of bit lines is selected for the read operation. The first set of bit lines are pre-charged to a pre-defined voltage level at 106. In one embodiment of the present disclosure, the pre-defined voltage is 0.7 V. At 108, a second set of bit lines of the array of bit lines are also charged to the pre-defined voltage level. The second set of bit lines is anti-phase to the first set of bit lines. The pre-charging of the first set of bit lines and the charging of the second set of bit lines are performed simultaneously. At 110, the reading of the first set of bit lines is performed. The operation of the reading of the first set of bit lines comprises sensing the current flowing in the first set of bit lines. Sensing the current flowing in the first set of bit lines may include discharging of these lines. During the read operation of the first set of bit lines, the second set of bit lines is maintained at the pre-defined voltage. It will be apparent to a person skilled in the art that the pre-defined voltage can also be set to a voltage other than 0.7 V. At 112, the method for performing the read operation terminates.

Figure 2A:
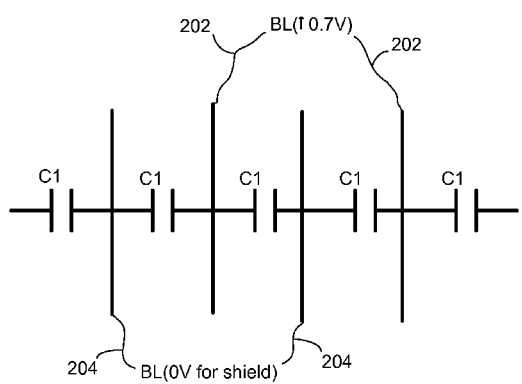
FIGS. 2A, 2B and 2C are schematic diagrams illustrating a bit line-bit line coupling capacitance and bit line waveforms of a read operation in a conventional NAND flash memory.
Figure 2B:
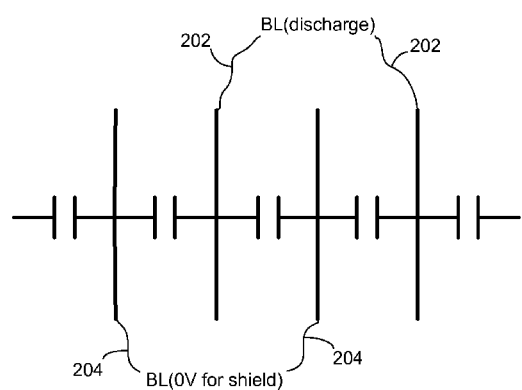
Figure 2C:
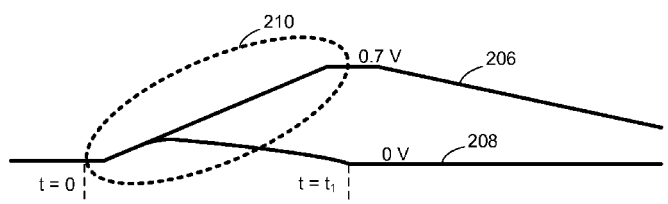

FIGS. 2A, 2B and 2C are schematic diagrams illustrating a bit line-bit line coupling capacitance and bit line waveforms of a read operation in a conventional NAND flash memory. FIGS. 2A, 2B and 2C are included herein to differentiate the bit line-bit line coupling capacitance and bit line waveforms of the read operation in accordance with the present disclosure (as discussed in conjunction with FIGS. 3A, 3B and 3C) from to the conventional way. FIGS. 2A, 2B, and 2C should not be considered limiting in any way.

FIG. 2A illustrates a simplified model of a bit line-bit line coupling capacitance during bit line pre-charging in a conventional NAND flash memory. In this NAND flash memory, the selected bit lines (referred herein in a group as BLs 202) are pre-charged to 0.7 V. In the conventional NAND flash memory following a shielded bit line architecture, the voltage level of the non-selected bit lines (referred herein in a group as BLs 204) are kept at a fixed voltage for shielding purposes. For example, as shown in FIG. 2A, voltage level of the each bit line of the BLs 204 are kept at 0 V. The non-selected bit-lines are anti-phase to the selected bit lines. As shown in FIG. 2A, each of the selected bit lines is positioned between the two non-selected bit lines. Due to a voltage difference between the BLs 202 and the BLs 204, a significant coupling capacitance 'C1' exists between each bit lines of the BLs 202 and 204. FIG. 2B illustrates a simplified model of a bit line-bit line capacitance during bit line discharge in the conventional NAND flash memory.

FIG. 2C illustrates a bit line waveform during the read operation in the conventional NAND flash memory. FIG. 2C includes a waveform 206, a waveform 208 and a ring area 210. The waveform 206 represents a pre-charging and discharging of one of the BLs 202. The waveform 208 represents the voltage level at one of the BLs 204 during the pre-charging and discharging of the one of the BLs 202. It is shown in FIG. 2C that from t=0, one of the BLs 202 starts ramping up to a voltage level of 0.7 V, while the voltage of the one of the BLs 204 is at 0 V. However, there is a small surge in the voltage level at the one of the BLs 204 due to the coupling capacitance C1. At time $t=t_1$, the voltage level of the one of the BLs 202 starts decreasing towards 0 V, whereas the one of the BLs 204 acts as a shield line for the one of the BLs 202 by maintaining its voltage at 0 V. The ring area 210 represents the time elapsed in the pre-charging of the one of the BLs 202.

The time elapsed in the pre-charging of the one of the BLs 202 is high due to the coupling capacitance C1 between the BLs 202 and the BLs 204.

FIGS. 3A, 3B and 3C are schematic diagrams illustrating a bit line-bit line coupling capacitance and bit line waveforms in the read operation in the NAND flash memory. FIG. 3A represents a simplified model of bit line—bit line coupling capacitance between a first set of bit lines 302 (referred herein as BLs 302) and a second set of bit lines 304 (referred herein as BLs 304) during pre-charging of the BLs 302. The BLs 304 are in anti-phase of the BLs 302. A capacitance denoted as 'C2' exists between each bit line of the BLs 302 and the BLs 304. During the read operation of the BLs 302, each bit line of the BLs 302 is pre-charged to a pre-defined voltage level. The pre-defined voltage is taken 0.7 V in FIG. 3A for exemplary purposes only, and it should not be considered limiting in any way. Each bit line of the BLs 304 is also charged to the pre-defined voltage level. Due to the zero voltage difference between the each of the BLs 302 and 304, the value of the coupling capacitance C2 is less than the coupling capacitance C1 as described in FIG. 2A.

FIG. 3B illustrates a simplified model of a bit line-bit line capacitance during discharge of the BLs 302 in the NAND flash memory. During the discharge of the BLs 302, the voltage level at the BLs 304 is maintained at the pre-defined voltage. FIG. 3C represents a bit line waveform during the read operation in the NAND flash memory. FIG. 3C includes a waveform 306, a waveform 308 and a ring area 310. At t=0, voltage levels of each of BLs 302 and BLs 304 start ramping up to the pre-defined voltage level (herein a voltage of 0.7 V). At t=$t_1$, each of the BLs 302 starts discharging, which results in decrease in their voltage level. The voltage level at each of the BLs 304 is maintained at the pre-defined level. The ring area 310 represents the time elapsed during the pre-charging of the BLs 302 to the pre-defined level.

By comparing the ring area 310 with the ring area 210, it is apparent that the time elapsed in the pre-charging of the BLs 302 is less than the pre-charging of the BLs 202. The BLs 302 and the BLs 202 are same except with regard to their respective anti-phase bit lines. The BLs 304 is charged to the pre-defined voltage, whereas the BLs 204 is at zero voltage level during the pre-charging. In this manner, the pre-charge time of the first set of BLs 302 (the selected BLs for read operation) can be greatly reduced by charging the bit lines that are anti-phase to the BLs 302 to the pre-defined voltage. Due to the fast recharge of the BLs 302, the time for the read operation in the NAND flash memory can be shortened.

Figure 4A:
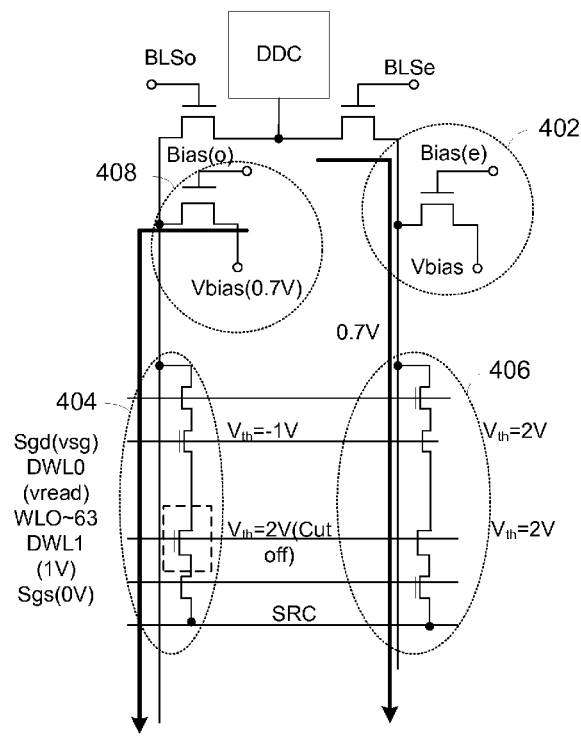
FIGS. 4A and 4B illustrate a semiconductor circuit for performing read operation in a NAND flash memory, according to an exemplary embodiment of the present disclosure.
Figure 4B:
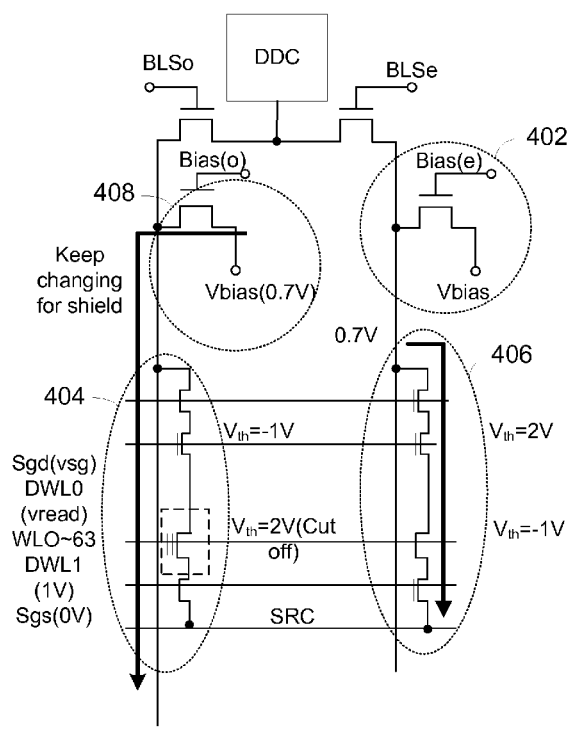

FIGS. 4A and 4B illustrate a semiconductor circuit for performing read operation in a NAND flash memory. Referring to FIG. 4A, an exemplary representation of pre-recharging in the NAND flash memory is illustrated. The NAND flash memory comprises an array of bit lines. The semiconductor circuit 400 includes a pre-charging circuitry 402, a charging circuitry 404, a circuitry for reading the first set of bit lines 406 and a biasing circuitry 408. The pre-charging circuitry 402 pre-charges a first set of bit lines to a pre-defined voltage. BLSe represents a bit line select line for a bit line of the first set of bit lines, which is to be read. The BLSo represents a bit line select line for a bit line of the second set of bit lines. The second set of bit lines is anti-phase to the first set of bit lines. The pre-charging circuitry 402 pre-charges the selected even bit line (BLSe) to a pre-defined voltage level, which voltage is 0.7 V in one embodiment of the present disclosure. At the same time, the charging circuitry 404 charges the non-selected odd bit line (BLSo) to the pre-defined voltage, which is 0.7 V in this embodiment.

FIG. 4B illustrates an exemplary representation of bit line discharging during the read operation in the NAND flash memory. The circuitry of reading the first set of bit lines 406 starts reading the selected even bit line. The voltage level of the selected even bit line drops to the zero volt. During the reading operation, the biasing circuitry 408 maintains the pre-defined voltage (in one embodiment, 0.7 V) at the non-selected odd bit line.

The foregoing descriptions of specific embodiments of the present disclosure have been presented for purposes of illustration and description. They are not intended to be exhaustive or to limit the disclosure to the precise forms disclosed, and obviously many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A method for performing a read operation in a NAND flash memory, the NAND flash memory comprising an array of bit lines, the method comprising:
   selecting a first set of bit lines of the away of bit lines for the read operation;
   pre-charging the first set of bit lines to a pre-defined voltage level;
   charging a second set of bit lines of the away of bit lines to the pre-defined voltage level, wherein the second set of bit lines is anti-phase to the first set of bit lines; and
   reading the first set of bit lines;
   wherein the second set of bit lines is maintained at the pre-defined voltage level during the reading of the first set of bit lines.

2. The method of claim 1, wherein the pre-charging the first set of bit lines and the charging the second set of bit lines are performed simultaneously.

3. The method of claim 1, wherein reading the first set of bit lines comprises discharging the first set of bit lines for sense operation.

4. A semiconductor circuit for performing a read operation in a NAND flash memory, the NAND flash memory comprising an away of bit lines, the semiconductor circuit comprising:
   pre-charging circuitry for pre-charging a first set of bit lines of the array of bit lines to a pre-defined voltage;
   charging circuitry for charging a second set of bit lines of the array of the bit lines to the pre-defined voltage level, wherein the second set of bit lines is anti-phase to the first set of bit lines;
   circuitry for reading the first set of bit lines; and
   biasing circuitry for maintaining voltage level of the second set of bit lines equal to the pre-defined voltage during the reading of the first set of bit lines.

5. The semiconductor circuit of claim 4, wherein the pre-charging circuitry pre-charges the first set of bit lines and the charging circuitry charges the second set of bit lines to the pre-defined level simultaneously.

6. The semiconductor circuit of claim 4, wherein reading the first set of bit lines comprises discharging the first set of bit lines for sense operation.

* * * * *